United States Patent
Bang (10) Patent No.: US 12,085,622 B2
(45) Date of Patent: Sep. 10, 2024

(54) BATTERY CELL RESISTANCE MEASUREMENT DEVICE AND METHOD

(71) Applicant: LG Energy Solution, Ltd., Seoul (KR)

(72) Inventor: Kyung Sup Bang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 552 days.

(21) Appl. No.: 17/292,747

(22) PCT Filed: Nov. 29, 2019

(86) PCT No.: PCT/KR2019/016797
§ 371 (c)(1),
(2) Date: May 11, 2021

(87) PCT Pub. No.: WO2020/111896
PCT Pub. Date: Jun. 4, 2020

(65) Prior Publication Data
US 2021/0396815 A1    Dec. 23, 2021

(30) Foreign Application Priority Data
Nov. 30, 2018    (KR) .................. 10-2018-0152645

(51) Int. Cl.
*G01R 31/389*    (2019.01)
*G01R 31/396*    (2019.01)
*H02J 7/00*    (2006.01)

(52) U.S. Cl.
CPC ......... *G01R 31/389* (2019.01); *G01R 31/396* (2019.01); *H02J 7/0013* (2013.01);
(Continued)

(58) Field of Classification Search
CPC .................................................. G01R 31/389
(Continued)

(56) References Cited

U.S. PATENT DOCUMENTS

| 7,847,519 B2 | 12/2010 | Ho |
| 9,459,323 B2 | 10/2016 | Mukaitani et al. |

(Continued)

FOREIGN PATENT DOCUMENTS

| CN | 1061289 A | 5/1992 |
| CN | 1967270 A | 5/2007 |

(Continued)

OTHER PUBLICATIONS

International Search Report for Application No. PCT/KR2019/016797 dated Mar. 9, 2020, pp. 1-3.
(Continued)

*Primary Examiner* — Edward Tso
*Assistant Examiner* — Ahmed H Omar
(74) *Attorney, Agent, or Firm* — Lerner David LLP (57) ABSTRACT

A battery cell resistance measurement device including: a carrier signal generation module configured to generate a carrier signal of a first frequency and a second frequency different from the first frequency; a resistance unit including a first resistor and a second resistor having a different resistance value from the first resistor; an impedance measurement unit configured to measure an impedance of both ends of a corresponding application target in a state where the carrier signal is applied to any one of the first resistor, the second resistor, and a battery cell; a switching unit configured to selectively connect any one of the first resistor, the second resistor, and the battery cell to the impedance measurement unit; and a control unit configured to calculate an internal resistance of the battery cell based on the impedance value measured by the impedance measurement unit.

15 Claims, 8 Drawing Sheets

(52) U.S. Cl.
CPC ............ *H02J 7/0048* (2020.01); *H02J 7/005* (2020.01); *H02J 7/00712* (2020.01)

(58) Field of Classification Search
USPC .......................................................... 320/134
See application file for complete search history.

(56) References Cited

U.S. PATENT DOCUMENTS

| | | | |
|---|---|---|---|
| 10,386,422 B2 * | 8/2019 | Christensen | ............ B60L 58/12 |
| 2006/0186890 A1 | 8/2006 | Iwane et al. | |
| 2007/0252601 A1 | 11/2007 | Satoh et al. | |
| 2008/0100298 A1 | 5/2008 | Yun et al. | |
| 2011/0101986 A1 | 5/2011 | Shen et al. | |
| 2011/0269046 A1 | 11/2011 | Suematsu | |
| 2012/0306504 A1 | 12/2012 | van Lammeren | |
| 2013/0253862 A1 | 9/2013 | Luo et al. | |
| 2014/0287287 A1 | 9/2014 | Osaka et al. | |
| 2015/0070024 A1 | 3/2015 | Kim et al. | |
| 2015/0198675 A1 | 7/2015 | Hebiguchi | |
| 2017/0003354 A1 * | 1/2017 | Morrison | ........... G01R 31/3842 |
| 2017/0176512 A1 | 6/2017 | Pritelli et al. | |
| 2017/0219660 A1 | 8/2017 | Christensen et al. | |

FOREIGN PATENT DOCUMENTS

| | | | |
|---|---|---|---|
| CN | 102175921 A | | 9/2011 |
| CN | 102282710 A | | 12/2011 |
| CN | 102809691 A | | 12/2012 |
| CN | 104502723 A | | 4/2015 |
| CN | 105738826 A | | 7/2016 |
| CN | 106526321 A | | 3/2017 |
| CN | 106896274 A | | 6/2017 |
| JP | 2003315393 A | | 11/2003 |
| JP | 2004028663 A | | 1/2004 |
| JP | 2004061372 A | | 2/2004 |
| JP | 2004235100 A | | 8/2004 |
| JP | 2005180927 A | | 7/2005 |
| JP | 2008016275 A | | 1/2008 |
| JP | 2008175687 A | | 7/2008 |
| JP | 4477185 B2 | | 6/2010 |
| JP | 4495141 B2 | | 6/2010 |
| JP | 4569575 B2 | | 10/2010 |
| JP | 2010223968 A | | 10/2010 |
| JP | 2013032947 A | | 2/2013 |
| JP | 2013088148 A | | 5/2013 |
| JP | 2015052590 A | | 3/2015 |
| JP | 2015055516 A | | 3/2015 |
| JP | 5906491 B2 | | 4/2016 |
| JP | 2016167336 A | | 9/2016 |
| JP | 2017040615 A | | 2/2017 |
| JP | 2017194476 A | | 10/2017 |
| JP | 6256027 B2 | | 1/2018 |
| JP | WO2017009891 A1 | | 4/2018 |
| JP | 2018523814 A | | 8/2018 |
| KR | 100846712 B1 | | 7/2008 |
| KR | 20090056847 A | | 6/2009 |
| KR | 101160545 B1 | | 6/2012 |
| KR | 20180062814 | * | 6/2018 ............ G01R 27/02 |
| KR | 20180062814 A | | 6/2018 |
| WO | 2017003917 A1 | | 1/2017 |

OTHER PUBLICATIONS

Extended European Search Report for EP Application No. 19890181 dated Dec. 9, 2021, 2 pgs.
Search Report dated Feb. 27, 2024 from Office Action for Chinese Application No. 201980076216 issued Mar. 1, 2024. 3 pgs.

* cited by examiner

BATTERY CELL RESISTANCE MEASUREMENT DEVICE AND METHOD

CROSS-REFERENCE TO RELATED APPLICATIONS

The present application is a national phase entry under 35 U.S.C. § 371 of International Application No. PCT/KR2019/016797, filed Nov. 29, 2019, published in Korean, which claims priority from Korean Patent Application No. 10-2018-0152645, filed Nov. 30, 2018, all of which are incorporated by reference.

TECHNICAL FIELD

The present invention relates to a device and method for measuring battery cell resistance.

BACKGROUND ART

In order to estimate battery resistance deterioration conventionally, by extracting the resistance data of the battery during the operating cycle, and using the resistance data extracted under a specific temperature and a specific state of charge (SOC) condition to calculate the ratio of resistance to the initial battery, the calculated resistance ratio was used for battery's real time SOC estimation, capacity estimation and battery life estimation.

However, such a battery resistance deterioration estimation method applies a degeneration rate only at a specific temperature and a specific SOC condition, so that it is difficult to accurately calculate the resistance of the battery according to the external noise and the external load.

SUMMARY

Technical Problem

The present invention has been made to solve the above problems, to provide a battery cell resistance measurement device and method and a battery pack capable of accurately measuring the internal resistance of the battery cell without being affected by changes in external noise and external load.

Technical Solution

A battery cell resistance measurement device according to an embodiment of the present invention includes: a carrier signal generation module configured to generate a first carrier signal at a first frequency and a second carrier signal at a second frequency different from the first frequency; a first resistor; a second resistor having a different resistance value from the first resistor; an impedance measurement unit configured to measure an impedance of a target while the first or second carrier signal is applied to the target; a switching unit configured to selectively connect any one of the first resistor, the second resistor, and the battery cell to the impedance measurement unit, wherein whichever of the first resistor, the second resistor, or the battery cell that is connected to the impedance measurement unit is the target; and a control unit configured to calculate an internal resistance of the battery cell based on the impedance of one or more targets measured by the impedance measurement unit.

The control unit is configured to: generate an adjustment parameter based on an impedance value measured by applying a given one of the first or second carrier signal to each of the first resistor and the second resistor, and calculate an internal resistance of the battery cell based on an impedance value measured by applying the given one of the first or second carrier signal to the battery cell and the adjustment parameter.

Here, the first carrier signal is a high impedance carrier signal at a frequency equal to or less than a preset first reference frequency wherein the second carrier signal is a high impedance carrier signal at a frequency equal to or greater than a preset second reference frequency, and wherein the first reference frequency is less than the second reference frequency.

A resistance of the first resistor is an expected minimum resistance value when the battery cell is in an open voltage state, wherein a resistance of the second resistor is set to an expected maximum resistance value when the battery cell is in an open voltage state.

For example, the impedance measurement unit further comprises a signal processing unit configured to: generate an I signal of the same phase as an impedance signal received through the impedance measurement unit and a Q signal delayed by 90 degrees with respect to the impedance signal; and remove a noise component from the measured impedance signal based on the generated I signal and the generated Q signal.

The control unit may be configured to calculate a DC component resistance and an AC component impedance of an internal resistance using the first and second carrier signals.

The control unit may be configured to calculate a capacity of the battery cell based on the calculated DC component resistance and AC component impedance.

In addition, the control unit may be configured to estimate a life of the battery cell based on the calculated DC component resistance and AC component impedance.

In addition, a battery cell resistance measurement method according to an embodiment of the present invention includes: measuring a first impedance value of a target while a first carrier signal at a first frequency or a second carrier signal at a second frequency different from the first frequency is applied to the target, wherein the target is switchable between each of a first resistor and a second resistor having a different resistance value than the first resistor; generating an adjustment parameter based on the measured first impedance value; measuring a second impedance value of a battery cell while the first carrier signal or the second carrier signal is applied to the battery cell; and calculating an internal resistance of the battery cell based on the second impedance value and the adjustment parameter.

The first impedance value is measured for each of the first resistor and the second resistor while the first carrier signal is applied to each of the first resistor and the second resistor, and wherein the adjustment parameter is based on the measured first impedance values of each of the first and second resistors, the method further comprising: measuring a third impedance value of a target for each of the first resistor and the second resistor while the second carrier signal is applied to each of the first resistor and the second resistor; and generating a second adjustment parameter based on the third impedance values of each of the first resistor and the second resistor.

Here, the first carrier signal is a high impedance carrier signal at a frequency equal to or less than a preset first reference frequency, wherein the second carrier signal is a high impedance carrier signal at a frequency equal to or greater than a preset second reference frequency, wherein the first reference frequency is less than the second reference frequency.

In addition, the calculating of the internal resistance of the battery cell includes: calculating a total internal resistance including a DC component resistance and an AC component impedance of the battery cell based on the first adjustment parameter and a fourth impedance value measured from the battery cell by applying the first carrier signal to the battery cell; calculating the DC component resistance of the battery cell based on the second adjustment parameter and a fifth impedance value measured from the battery cell by applying the second carrier signal of the second frequency to the battery cell; and calculating the AC component impedance of the internal resistance of the battery cell by subtracting the calculated DC component resistance from the calculated total internal resistance.

A resistance of the first resistor is at an expected minimum resistance value when the battery cell is in an open voltage state, wherein a resistance of the second resistor is at an expected maximum resistance value when the battery cell is in an open voltage state.

In addition, the measuring of the impedance value of the battery cell or the target includes: generating an I signal of the same phase as an impedance signal and a Q signal delayed by 90 degrees with respect to the impedance signal; and performing signal processing to remove a noise component from the measured impedance signal based on the generated I signal and the generated Q signal.

Meanwhile, a battery pack according to an embodiment of the present invention includes: at least one battery cell capable of charging and discharging; a battery management system configured to control charging and discharging of the battery cell; and a battery cell resistance measurement device configured to measure an internal resistance of the battery cell.

Advantageous Effects

According to the present invention, it is possible to accurately measure the internal resistance of the battery cell without being affected by external noise and changes in load.

In addition, by using the measured internal resistance of the battery cell, it is possible to accurately predict the power of the battery cell and the life of the battery cell.

Other effects of the present invention will be further described according to the following examples.

DETAILED DESCRIPTION

Hereinafter, some embodiments of the present invention will be described in detail through exemplary drawings. It should be noted that, in assigning reference numerals to components of each drawing, although the components are displayed on different drawings, like reference numerals refer to like components. Additionally, in describing the inventive concept, detailed descriptions of well-known configurations or functions will be omitted if it is determined that they would obscure the subject matter of the inventive concept.

Figure 1:
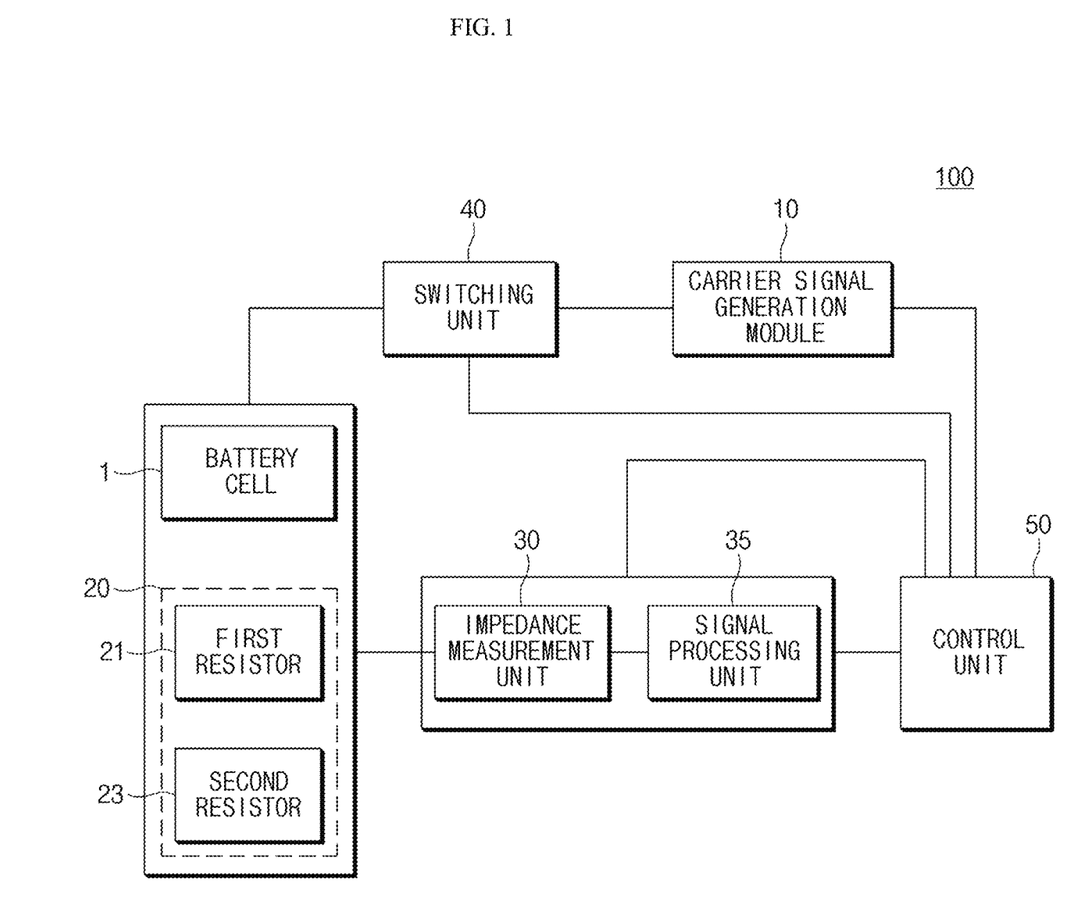
FIG. 1 is a block diagram showing the configuration of a battery pack including a battery cell resistance measurement device according to an embodiment of the present invention.

First, a battery cell resistance measurement device according to the present invention will be described with reference to FIG. 1. FIG. 1 is a block diagram showing the configuration of a battery pack 100 including a battery cell resistance measurement device according to an embodiment of the present invention.

As shown in FIG. 1, a battery cell resistance measurement device according to an embodiment of the present invention includes a carrier signal generation module 10, a resistance unit 20, an impedance measurement unit 30, a switching unit 40, and a control unit 50.

First, the carrier signal generation module 10 is a module for generating carrier signals of the first frequency and the second frequency and generates a current signal as a carrier signal having a high impedance to be injected into the battery cell 1. Here, if the impedance is small, since the measured value may vary depending on the load impedance, the carrier signal generation module 10 has a high impedance which is not affected by the load impedance, and generates and outputs a carrier signal of the first frequency or the second frequency as a constant current waveform by the frequency control signal of the control unit 50.

As an example, the carrier signal of the first frequency is a high impedance carrier signal at a preset low frequency and further, the carrier signal of the second frequency is a high impedance carrier signal at a preset high frequency. In other words, the carrier signal of the first frequency is a high impedance carrier signal below the first reference frequency, and the carrier signal of the second frequency is a high impedance carrier signal above the second reference frequency. Here, the first reference frequency is smaller than the second reference frequency. For example, the first reference frequency may be a low frequency of 1 to 2 Hz or less, and the second reference frequency may be a high frequency of 10 kHz or more.

The resistance unit 20 may include a plurality of resistors, and includes at least a first resistor 21 and a second resistor 23. In one example, the first resistor 21 is set to the expected lowest resistance value when the battery cell 1 is in an open voltage state. For example, the first resistor 21 may be set to 0 ohms as a minimum value for making the reference value to a value assuming that the battery impedance is shorted. In addition, the second resistor 23 is set to an expected maximum resistance value when the battery cell 1 is in an open voltage state. For example, the second resistor 23 may be set in the range of 0.05 ohm to 0.3 ohm as a maximum value margined in consideration of degeneration of the battery and the like.

The impedance measurement unit 30 has a configuration which measures the impedance of both ends of the corresponding application object in a state where a carrier signal of the first or second frequency is applied to any one of the first resistor 21, the second resistor 23, and the battery cell 1. For example, in a state where a first frequency carrier signal is applied to the first resistor 21, the impedance measurement unit 30 may measure the impedance of both ends of the first resistor 21, and in a state where a second frequency carrier signal is applied to the first resistor 21, the impedance measurement unit 30 may measure the impedance of both ends of the first resistor 21. In the same manner, the respective impedances can also be measured for the second resistor 23 and the battery cell 1.

In addition, the impedance measurement unit 30 may further include a signal processing unit 35 for generating an I signal of the same phase and a Q signal delayed by 90 degrees with respect to each of the measured impedance signals and removing a noise component from each measured impedance signal based on the generated I/Q signals. Accordingly, the influence by external noise can be eliminated.

In one example, the impedance measurement unit 30 and the signal processing unit 35 may be implemented as one configuration, or may be implemented in a separate configuration.

The switching unit 40 has a configuration for selectively connecting any one of the first resistor 21, the second resistor 23, and the battery cell 1 to the impedance measurement unit 30. For example, the first resistor and/or the second resistor may be configured to be connected in parallel between both ends of the battery cell 1 through the switches of the switching unit 40. Accordingly, by controlling ON/OFF of each switch of the switching unit 40, only one of the first resistor 21, the second resistor 23, and the battery cell 1 may be connected to the carrier signal generation module 10 and the impedance measurement unit 30. The switching unit 40 may be controlled by the switching control signal of the control unit 50 or the impedance measurement unit 30.

Furthermore, the control unit 50 is a processing unit that calculates the internal resistance of the battery cell 1 based on the impedance value measured by the impedance measurement unit 30.

In detail, the control unit 50 may generate the adjustment parameter based on the measured impedance value by applying the carrier signal of the first frequency and the carrier signal of the second frequency, respectively, with respect to each of the first resistor 21 and the second resistor 23.

For example, based on the first impedance value measured by applying the carrier signal of the first frequency to the first resistor 21 and the second impedance value measured by applying the carrier signal of the first frequency to the second resistor 23, a first adjustment parameter may be generated at the first frequency. In addition, based on the third impedance value measured by applying the carrier signal of the second frequency to the first resistor 21 and the fourth impedance value measured by applying the carrier signal of the second frequency to the second resistor 23, a second adjustment parameter may be generated at the second frequency.

Furthermore, based on the impedance value and the adjustment parameter measured by applying the carrier signal of the first frequency and the carrier signal of the second frequency with respect to the battery cell 1, the control unit 50 may calculate the internal resistance of the battery cell. For example, the fifth impedance value measured by applying the carrier signal of the first frequency to the battery cell 1 may be adjusted based on the first adjustment parameter at the first frequency, and the sixth impedance value measured by applying the carrier signal of the second frequency to the battery cell 1 may be adjusted based on the second adjustment parameter at the second frequency.

Also, when calculating the internal resistance of the battery cell, by using carrier signals of the first and second frequencies, the control unit 50 can calculate the DC component resistance and the AC component impedance of the internal resistance, respectively.

Figure 2:
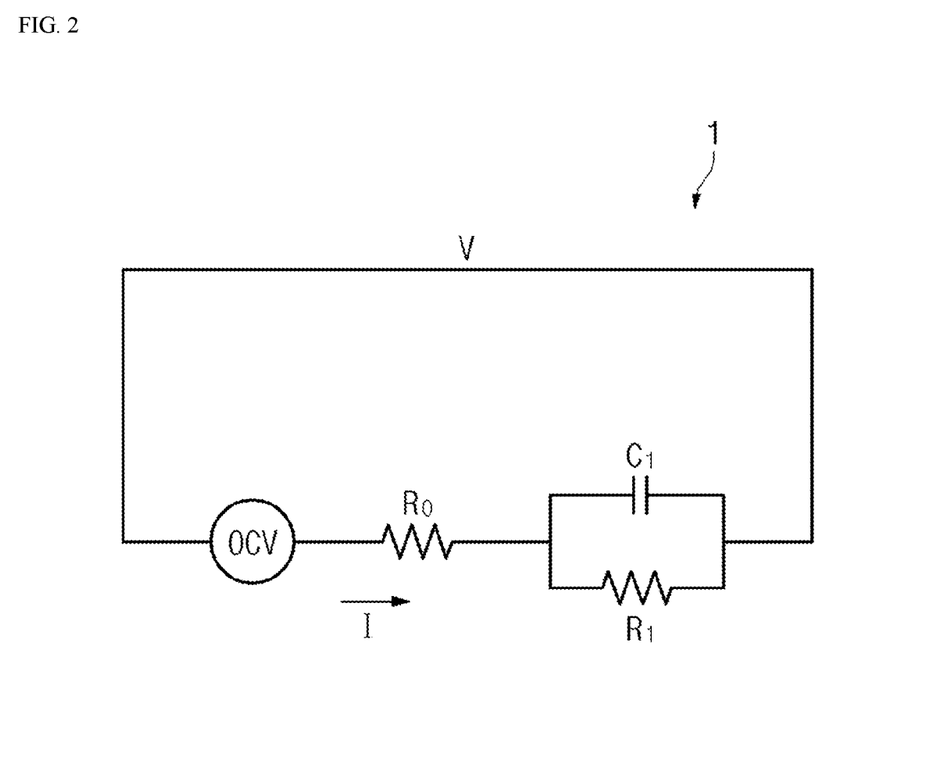
FIG. 2 is a diagram illustrating an equivalent circuit of an open voltage state of a battery cell.

Here, the internal resistance component of the battery cell will be described with reference to FIG. 2. FIG. 2 is a diagram illustrating an equivalent circuit of an open voltage state of a battery cell.

As shown in FIG. 2, the battery cell 1 is formed of a circuit in which a resistor R0, and a capacitor C1 and a resistor R1 of a parallel structure are connected in series in an open voltage state. The resistor R0 represents a DC component resistance, and the resistor R1 represents an AC component impedance. In other words, the internal resistance of the battery cell 1 consists of the resistor R0 and the resistor R1. By measuring such resistance R0 and resistance R1, it can use for SOC estimation, capacity estimation, life estimation, etc.

Referring to FIG. 1 again, for example, the control unit 50 adjusts the fifth impedance value measured by applying the carrier signal of the first frequency to the battery cell 1 based on the first adjustment parameter, the total internal resistance including the DC component resistance and AC component impedance of the battery cell 1 is calculated. In other words, when a high impedance carrier signal of a first frequency, that is, a low frequency, is applied to the battery cell 1, the impedance value measured from the battery cell 1 becomes a total impedance value in which the DC component resistance R0 and the AC component impedance R1 are added together. This is because the low-frequency high impedance carrier signal is measured by passing through the DC component resistance R0 and the AC component impedance R1 inside the battery cell 1.

Also, by adjusting the sixth impedance value measured by applying a carrier signal of the second frequency to the battery cell 1 based on the second adjustment parameter, the control unit 50 calculates the DC component resistance of the battery cell 1. In other words, when a high impedance carrier signal of a second frequency, that is, a high frequency, is applied to the battery cell 1, the impedance value measured from the battery cell 1 becomes the impedance value of only the DC component resistance R0. This is because a high-frequency high impedance carrier signal is measured through the DC component resistance R0 and the capacitor C1 inside the battery cell 1.

Accordingly, by subtracting the calculated DC component resistance from the calculated total internal resistance to calculate the AC component impedance, the control unit 50 can calculate the DC component resistance and the AC component impedance of the internal resistance, respectively.

In the above description, although it has been described that the control unit 50 calculates the internal resistance based on the impedance value measured by the impedance measurement unit 30, in consideration of not only the measured impedance value but also the actual temperature and SOC of the battery cell 1, the internal resistance of the battery cell 1 may be calculated.

Accordingly, the control unit 50 can calculate the capacity of the battery cell 1 using the calculated DC component resistance and AC component impedance.

Alternatively, the control unit 50 may predict the life of the battery cell using the calculated DC component resistance and AC component impedance.

In such a manner, according to the present invention, it is possible to accurately measure the internal resistance of the battery cell without being affected by external noise and changes in load. In addition, by using the measured internal resistance of the battery cell, it is possible to accurately predict the capacity of the battery cell and the life of the battery cell.

Figure 3:
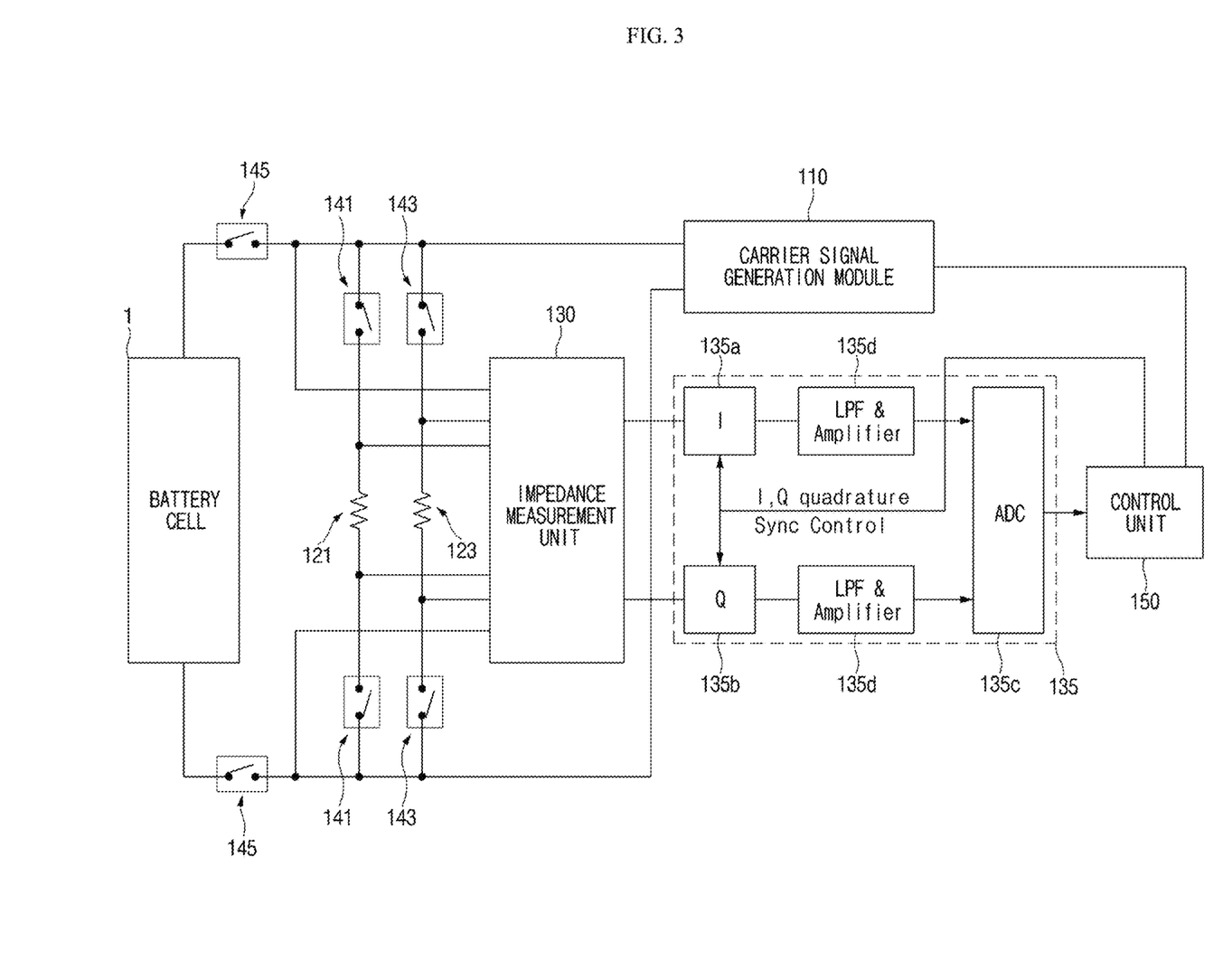
FIG. 3 is a detailed circuit diagram of a battery cell resistance measurement device according to an embodiment of the present invention.

As an embodiment, a battery cell resistance measurement device will be described with reference to FIG. 3. FIG. 3 is a detailed circuit diagram of a battery cell resistance measurement device according to an embodiment of the present invention.

As shown in FIG. 3, the battery cell resistance measurement device according to an embodiment of the present invention includes a carrier signal generation module 110, a first resistor 121, a second resistor 123, an impedance measurement unit 130, a switching unit, a signal processing unit 135, and a control unit 150.

First, the carrier signal generation module 110 receives a frequency control signal from the control unit 150 to generate a high impedance carrier signal of a predetermined low frequency (first frequency) or a predetermined high frequency (second frequency), and applies the generated high impedance carrier signal to any one of the battery cell 1, the first resistor 121, and the second resistor 123. The battery cell 1, the first resistor 121, and the second resistor 123 have a parallel structure.

The first resistor 121 has a resistance value of 0 ohms as an expected minimum resistance value when the battery cell is in an open voltage state, and the second resistor 123 has a resistance value of 0.05 ohms as an expected maximum resistance value when the battery cell is in an open voltage state.

The impedance measurement unit 130 is connected to common both ends of the battery cell 1, the first resistor 121, and the second resistor 123, which form a parallel structure, and measures an impedance value, that is, an impedance signal, from an application target selected from the battery cell 1, the first resistor 121, or the second resistor 123. Although not shown in the drawing, the impedance measurement unit 130 may include amplification means for primarily amplifying the impedance signal.

Subsequently, the switching unit is switching means for selectively applying a high impedance carrier signal to any one of the battery cell 1, the first resistor 121, or the second resistor 123, and for example, includes a first switch 141 connected in series to both ends of the first resistor 121, a second switch 143 connected in series to both ends of the second resistor 123, and a third switch 145 connected in series to both ends of the battery cell 1. For example, the first to third switches 141, 143, and 145 of the switching unit may operate by a switching control signal of the control unit 150, or may operate by a switching control signal from the impedance measurement unit 130.

Then, the signal processing unit 135 is, for example, a configuration to perform the signal processing of the orthogonal modulation method on the impedance signal received through the impedance measurement unit 130 to remove the influence of external noise, etc., and for example, includes an I circuit 135a for outputting an I signal of the same phase with respect to an impedance signal received through the impedance measurement unit 130, a Q circuit 135b for outputting a Q signal delayed by 90 degrees with respect to the impedance signal received through the impedance measurement unit 130, and an analog-to-digital converter (ADC) unit 135c for receiving the outputted I signal and Q signal, and performing analog-to-digital conversion and synthesis to remove the noise component. Also, a low pass filter and an amplifier unit 135d for low pass filtering and amplifying a corresponding output signal are included between the I circuit 135a and the ADC section 135c and between the Q circuit 135b and the ADC section 135c, respectively.

For example, as a constant current waveform outputted from the carrier signal generation module 110, when the carrier signal is $\sin(wt+\theta)$ and the internal impedance of the battery cell 1 is A, the impedance signal measured and outputted to the impedance measurement unit 130 becomes $A\sin(wt+\theta)$. The I circuit 135a receives $A\sin(wt+\theta)$ from the impedance measurement unit 130 and receives a synchronous frequency control signal of $A\sin(wt+\theta1)$ from the control unit 150 and outputs $A\sin(wt+\theta)*A\sin(wt+\theta1)=A/2 \cos(\theta-\theta1)-A/2 \cos(2wt+\theta+\theta1)$. At this time, among the signal components outputted from the I circuit 135a by the low pass filter and the amplifier unit 135d, the signal component of $-A/2 \cos(2wt+\theta+\theta1)$ is removed, so that $A/2 \cos(\theta-\theta1)=I(x)$ is inputted to the ADC unit 135c. Meanwhile, the Q circuit 135b receives $A\sin(wt+\theta)$ from the impedance measurement unit 130 and receives a frequency control signal delayed by 90 degrees of)$A\sin(wt+\theta1+90°)$ from the control unit 150, and outputs $A\sin(wt+\theta)*A\sin(wt+\theta1+90°)=A/2 \cos(\theta-\theta1-90°)-A/2 \cos(2wt+\theta+\theta1+90°)$. At this time, among the signal components outputted from the Q circuit 135b by the low pass filter and the amplifier unit 135d, the signal component of $-A/2 \cos(2wt+\theta+\theta1+90°)$ is removed, so that $A/2 \cos(\theta-\theta1-90°)=Q(y)$ is inputted to the ADC unit 135c. Subsequently, the ADC unit 135c analog-to-digital converts the input signals, synthesizes the converted signals by $\sqrt{I(x)^2+Q(y)^2}$, and outputs the synthesized signal. Through this, the control unit 150 may receive and calculate the internal impedance A of the battery cell 1 from which the noise component is removed. In this manner, the signal processing unit 135 may remove the influence of external noise or the like on the impedance signal received through the impedance measurement unit 130.

Then, the control unit 150 calculates the internal resistance of the battery cell based on the impedance value measured by the impedance measurement unit 130, but generates an adjustment parameter based on an impedance value measured by applying a low frequency carrier signal and a high frequency carrier signal to each of the first resistor 121 and the second resistor 123, and adjusts the impedance value measured by applying a low frequency carrier signal and a high frequency carrier signal to the battery cell based on the adjustment parameter to calculate the internal resistance of the battery cell. At this time, the DC component resistance and the AC component impedance are respectively calculated as the internal resistance of the battery cell.

For example, in order to generate an adjustment parameter, the control unit 150 controls the first switch 141 to ON and the second and third switches 143 and 145 to OFF, and controls the carrier signal generation module 110 to output a low frequency high impedance carrier signal, so that it measures a first impedance value of the first resistor 121, controls the second switch 143 to ON, controls the first and third switches 141 and 145 to OFF, and controls the carrier signal generation module 110 to output a low frequency high impedance carrier signal so as to measure the second impedance value at the second resistor 123 and generate a first adjustment parameter at low frequency. Also, the control unit 150 controls the first switch 141 to ON and the second and third switches 143 and 145 to OFF and controls the carrier signal generation module 110 to output a high frequency high impedance carrier signal so that it measures a third impedance value of the first resistor 121, controls the second switch 143 to ON, controls the first and third switches 141 and 145 to OFF, and controls the carrier signal generation module 110 to output a high frequency high impedance carrier signal so as to measure the fourth impedance value at the second resistor 123 and generate a second adjustment parameter at high frequency. Here, the order of measuring the first to fourth impedance values is not particularly limited, and may be variously changed.

In addition, in order to calculate the DC component resistance and the AC component impedance which are internal resistances of the battery cell, respectively, for example, the control unit 150 controls the third switch 145 to ON and the first and second switches 141 and 143 to OFF, and controls the carrier signal generation module 110 to output a low frequency high impedance carrier signal so that it adjusts the fifth impedance value measured from the battery cell 1 based on the first adjustment parameter. At this time, when a low frequency high impedance carrier signal is applied to the battery cell 1, the impedance value measured from the battery cell 1 becomes a total impedance value obtained by adding the DC component resistance and the AC component impedance. In addition, the control unit 150 controls the third switch 145 to ON and the first and second switches 141 and 143 to OFF and controls the carrier signal generation module 110 to output a high frequency high impedance carrier signal so that it measures the impedance value in the battery cell 1 and adjusts the measured impedance value based on the adjustment parameter at high frequency. At this time, when a high frequency high impedance carrier signal is applied to the battery cell 1, the impedance value measured from the battery cell 1 becomes the impedance value of only the DC component resistance. In addition, the control unit 150 obtains the AC component impedance value by subtracting the impedance value of the DC component resistance only from the total impedance value.

Accordingly, the control unit 150 may accurately calculate the DC component resistance and the AC component impedance, which are internal resistances of the battery cell, respectively.

As described above, since the present invention calculates the DC component resistance and the AC component impedance, which are internal resistances of the battery cell, using low and high frequency, that is, multi-frequency high impedance carrier signals, the internal resistance of the battery cell can be calculated accurately without being affected by the external load of the battery cell.

In addition, the control unit 150 may calculate the capacity of the battery cell 1 or predict the life of the battery cell 1 using the calculated DC component resistance and AC component impedance. For example, a reference change table is prepared by comparing and analyzing actual measured values of a predetermined period of internal resistance components R0 and R1 of a battery after initial battery cell is mounted, so that capacity can be calculated and lifespan can be predicted. As described above, since it is a well-known technique to calculate the capacity of the battery cell 1 and predict the life thereof, detailed description thereof will be omitted.

Figure 4:
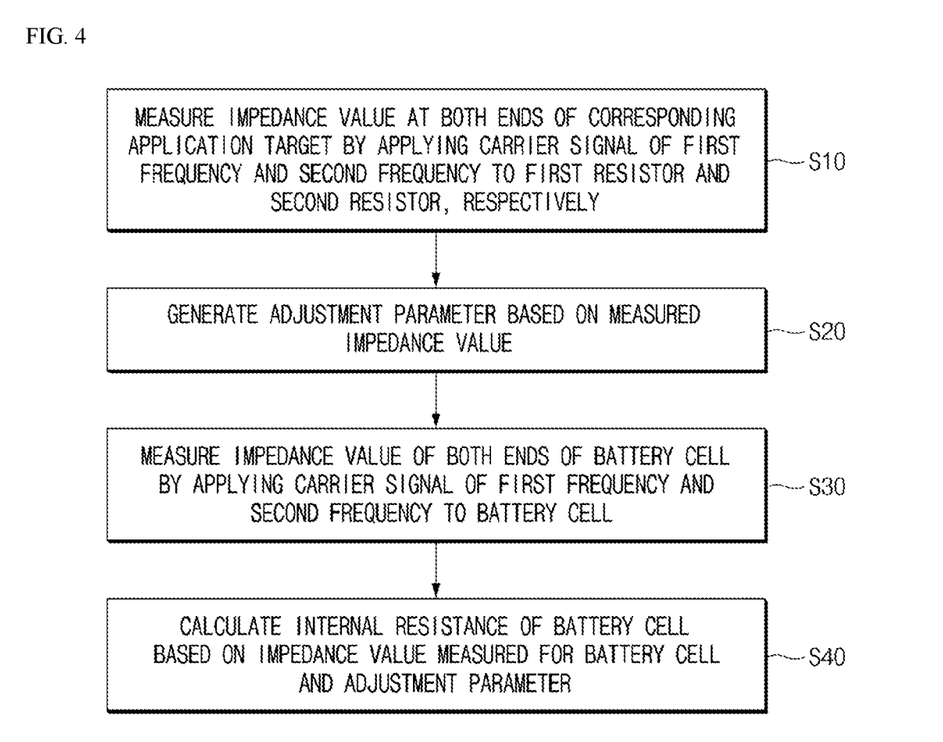
FIG. 4 is a flowchart illustrating a battery cell resistance measurement method according to an embodiment of the present invention.
Figure 5:
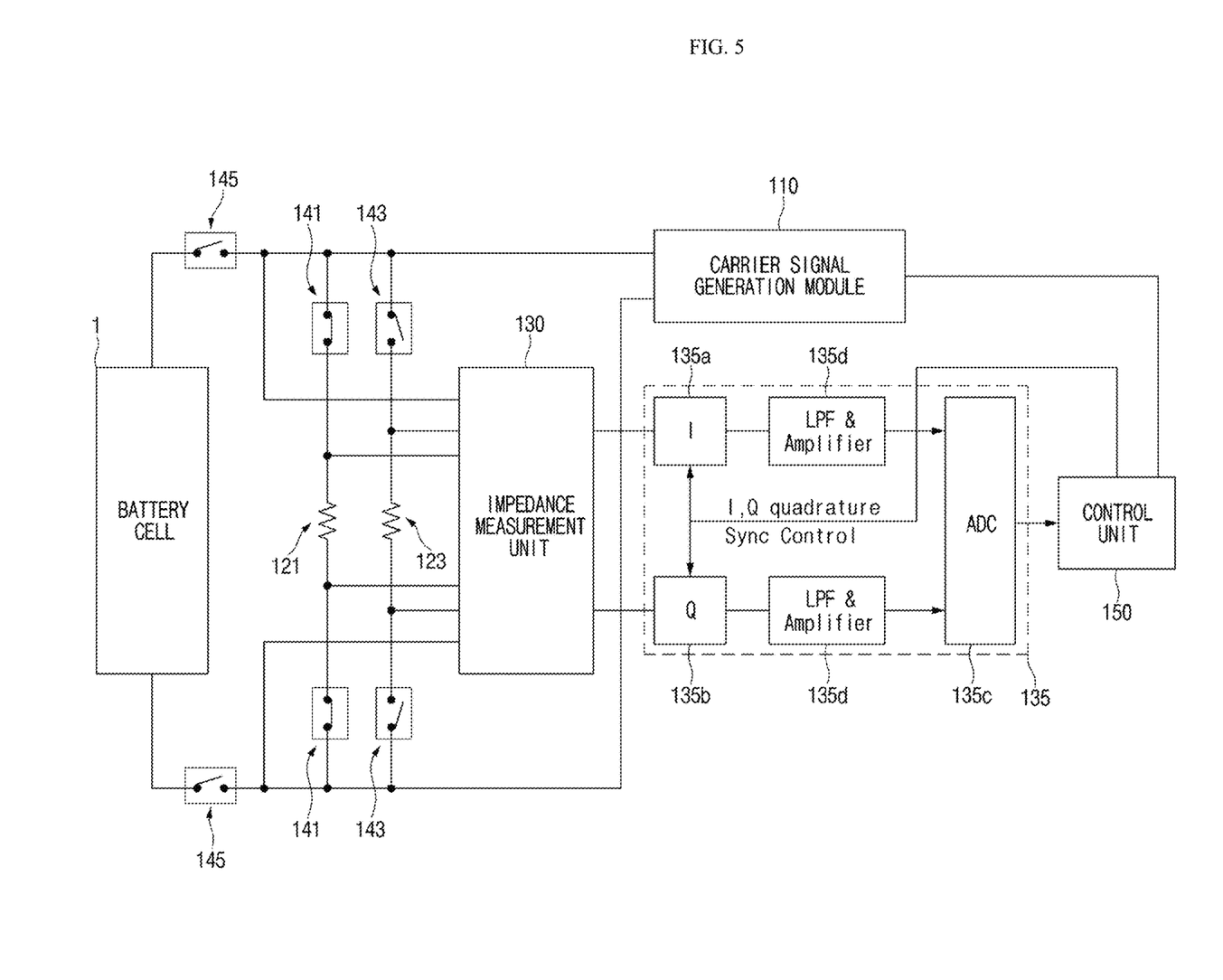
FIG. 5 is a first state diagram of a battery cell resistance measurement device according to an embodiment of the present invention.
Figure 6:
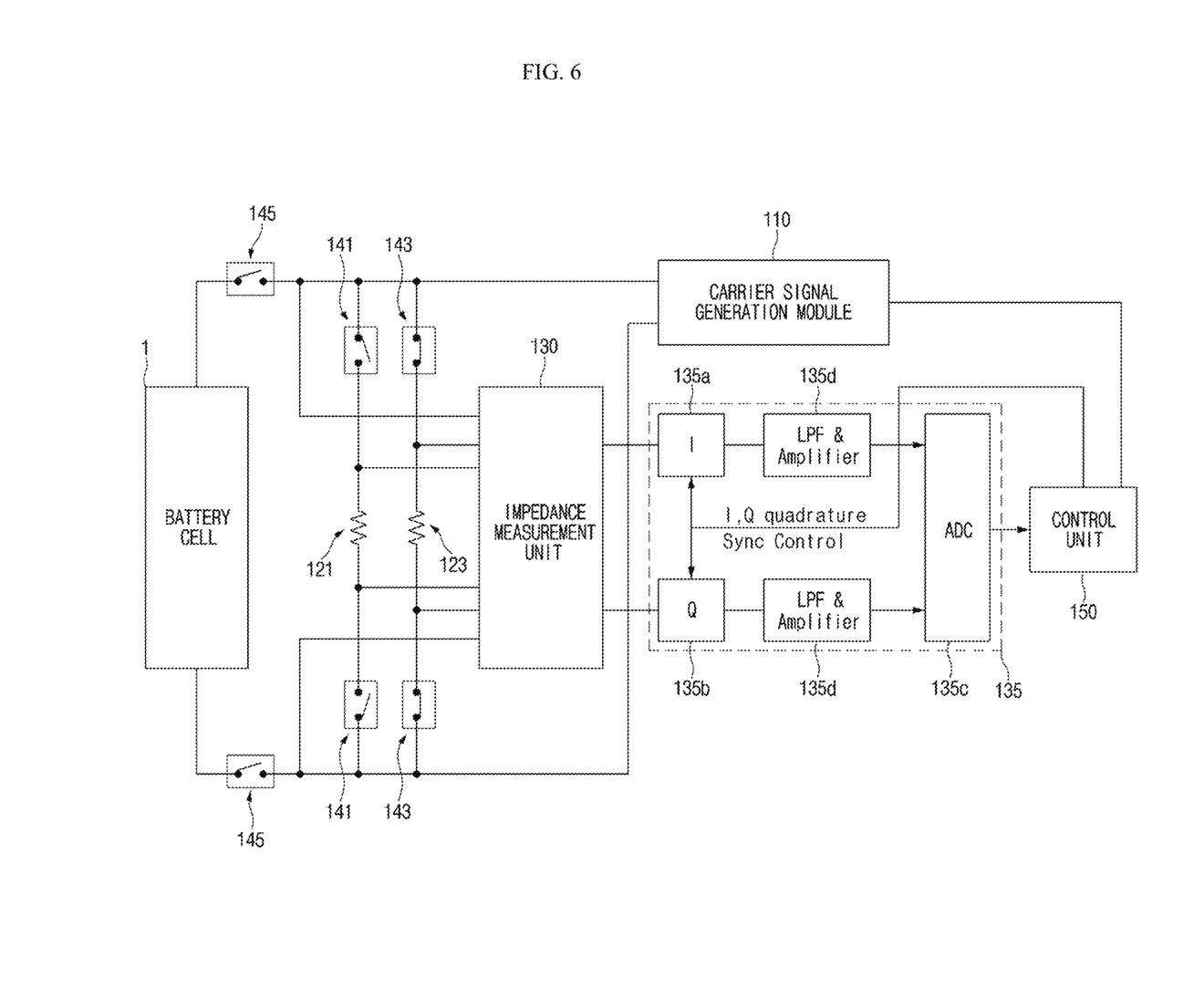
FIG. 6 is a second state diagram of a battery cell resistance measurement device according to an embodiment of the present invention.
Figure 7:
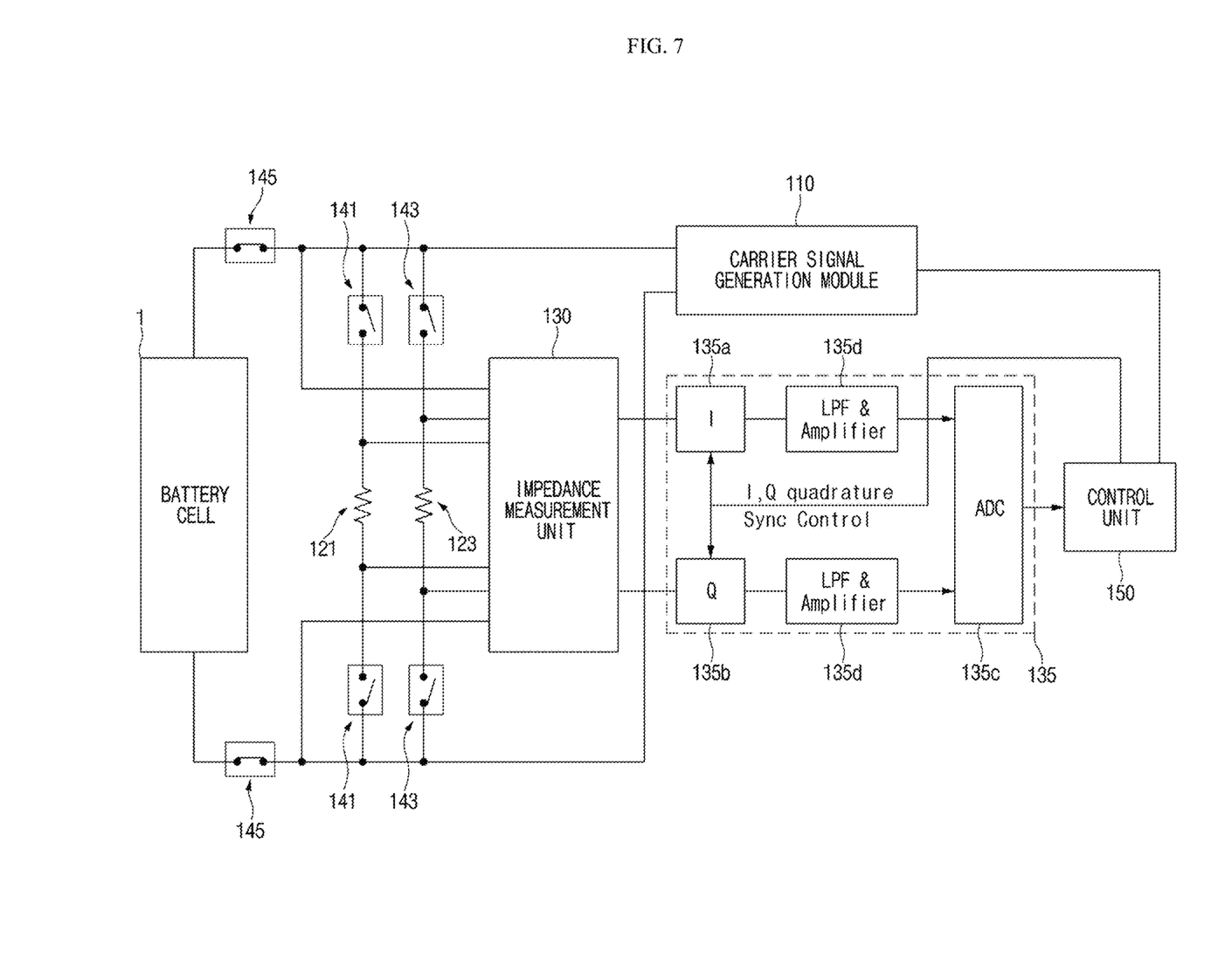
FIG. 7 is a third state diagram of a battery cell resistance measurement device according to an embodiment of the present invention.

Next, the battery cell resistance measurement method according to the present invention will be described with reference to FIGS. 4 to 7. FIG. 4 is a flowchart illustrating a method of measuring battery cell resistance according to an embodiment of the present invention. FIG. 5 is a first state diagram of a battery cell resistance measurement device according to an embodiment of the present invention. FIG. 6 is a second state diagram of a battery cell resistance measurement device according to an embodiment of the present invention. FIG. 7 is a third state diagram of a battery cell resistance measurement device according to an embodiment of the present invention.

First, as shown in FIG. 4, the battery cell resistance measurement method according to an embodiment of the present invention first measures the impedance value at both ends of the application target in a state where a carrier signal of a first frequency and a second frequency is applied to each of the first resistor and the second resistor (S10).

Here, the switching unit is controlled so as to be in a state of applying a carrier signal of a first frequency and a second frequency to each of the first and second resistors. For example, as in FIG. 5, by turning on the first switch 141 and turning off the second and third switches 143, 145, it allows a high impedance carrier signal from carrier signal generation module 110 to be selectively applied to first resistor 121, and also, as in FIG. 6, by turning on the second switch 143 and turning off the first and third switches 141 and 145, the high impedance carrier signal from carrier signal generation module 110 may be selectively applied to second resistor 123. By this, for example, a carrier signal of the first frequency is applied to the first resistor 121 to measure the first impedance value from the first resistor 121, and a carrier signal of the first frequency is applied to the second resistor 123 to measure the second impedance value from the second resistor 123. In addition, a carrier signal of the second frequency is applied to the first resistor 121 to measure the third impedance value from the first resistor 121, and a carrier signal of the second frequency is applied to the second resistor 123 to measure the fourth impedance value from the second resistor 123. Here, the order of measuring the first to fourth impedance values is not particularly limited, and may be measured in various orders according to the measurement environment and the setting order.

Subsequently, an adjustment parameter is generated based on the measured impedance value (S20). For example, the control unit 150 generates a first adjustment parameter at the first frequency based on the first impedance value and the second impedance value. Further, based on the third impedance value and the fourth impedance value, a second adjustment parameter at the second frequency is generated. Here, the order of generating the first and second adjustment parameters is not particularly limited.

Subsequently, in a state where carrier signals of a first frequency and a second frequency are respectively applied to the battery cells, impedance values of both ends of the battery cells are measured (S30).

Here, the switching unit is controlled so as to be in a state of applying a carrier signal of a first frequency and a second frequency to the battery cell. For example, as in FIG. 7, by turning on the third switch 145 and turning off the first and second switches 141, 143, the high impedance carrier signal from the carrier signal generation module 110 may be selectively applied to the battery cell 1. Thus, for example, the carrier signal of the first frequency is applied to the battery cell 1 to measure the fifth impedance value from the battery cell, and the carrier signal of the second frequency is applied to the battery 1 to measure the sixth impedance value from the battery cell. Here, the order of measuring the fifth and sixth impedance values is not particularly limited.

Subsequently, the internal resistance of the battery cell is calculated based on the impedance value and the adjustment parameter measured for the battery cell (S40).

For example, the calculating of the internal resistance of the battery cell (S40) may calculate the DC component resistance and the AC component impedance of the internal resistance, respectively. Specifically, in the calculating of the internal resistance of the battery cell (S40), the total internal resistance including the DC component resistance and AC component impedance of the battery cell can be calculated by adjusting the fifth impedance value based on the first adjustment parameter, and in addition, the DC component resistance of the battery cell can be calculated by adjusting the sixth impedance value based on the second adjustment parameter, and the AC component impedance can be calculated by subtracting the calculated DC component resistance from the calculated total internal resistance, so that the DC component resistance and the AC component impedance of the internal resistance can be calculated, respectively.

In one example, in the measuring of the first to sixth impedance values (S10, S30), an I signal of the same phase and a Q signal delayed by 90 degrees can be generated for each measured impedance signal, and based on the generated I/Q signals, signal processing for removing noise components from each of the measured impedance signals can be performed. Accordingly, the influence by external noise can be eliminated.

In addition, although not shown in the drawing, a battery cell resistance measurement method according to an embodiment of the present invention may further include at least one of calculating the capacity of the battery cell 1 using the calculated DC component resistance and AC component impedance and predicting the life of the battery cell by using the calculated DC component resistance and AC component impedance.

In another embodiment, although it is shown that the resistance unit 20 includes a plurality of resistors 21 and 23 in the foregoing embodiment, for example, one variable resistor may be used.

Figure 8:
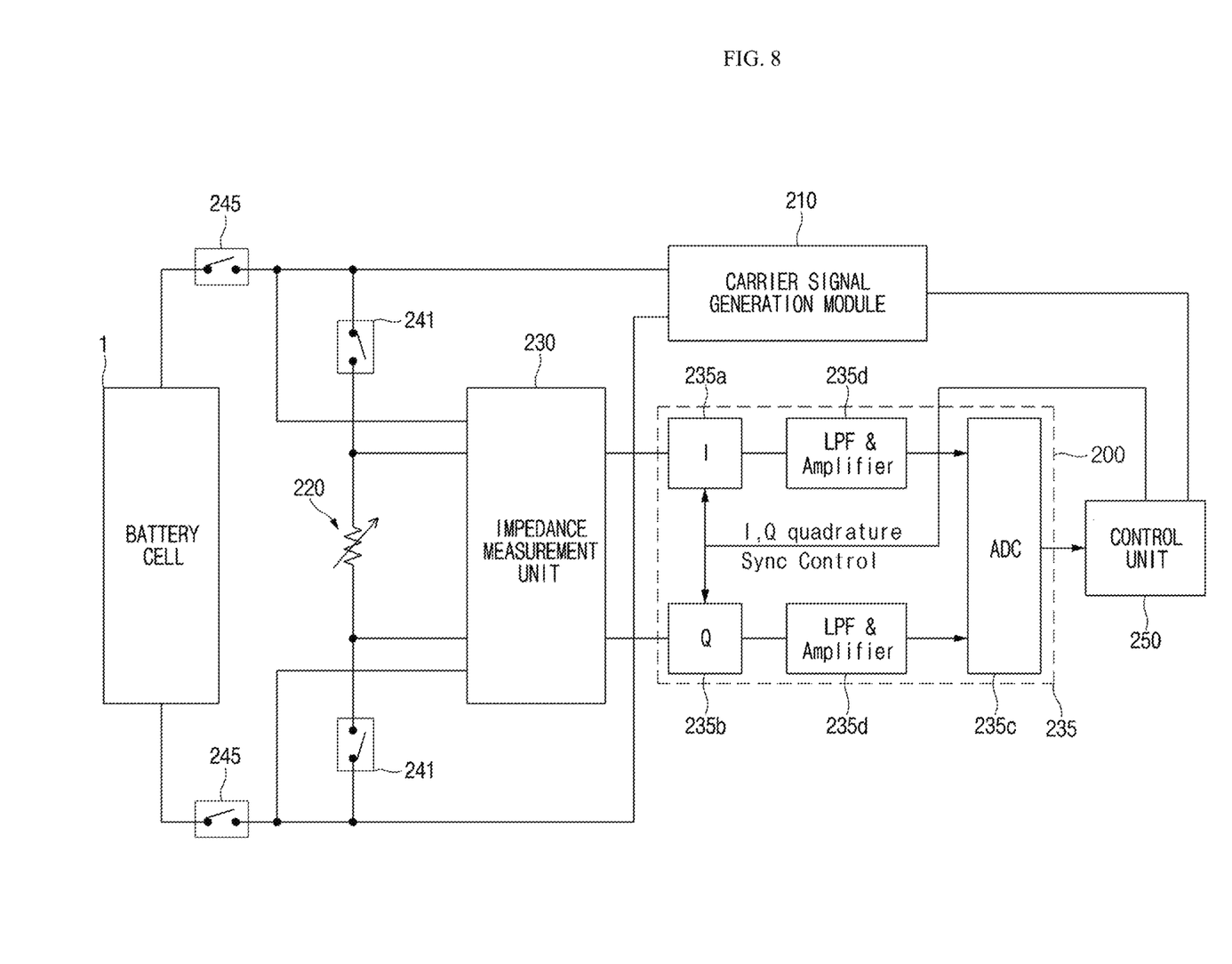
FIG. 8 is a detailed circuit diagram of a battery cell resistance measurement device according to another embodiment of the present invention.

FIG. 8 is a detailed circuit diagram of a battery cell resistance measurement device according to another embodiment of the present invention.

As shown in FIG. 8, the battery cell resistance measurement device according to another embodiment of the present invention includes a carrier signal generation module 210, a variable resistor 220, an impedance measurement unit 230, switching units 241 and 245, a signal processing unit 235, and a control unit 250.

Here, the resistance value of the variable resistor 220 may be changed by the impedance measurement unit 230 or the control unit 250. For example, the battery cell 1 may be adjusted to have a resistance value of 0 ohms as an expected minimum resistance value when the battery cell 1 is in an open state, or the battery cell 1 may be adjusted to have a resistance value of 0.05 ohms as an expected maximum resistance value when the battery cell 1 is in an open voltage state. At this time, for example, the first switch 241 controls ON and the second switch 245 controls OFF, and a low frequency carrier signal and a high frequency carrier signal from the carrier signal generation module 210 are applied to the variable resistor 220, so that by measuring the impedance value at each resistance value of the variable resistor 220, an adjustment parameter can be generated.

Since the detailed descriptions of the carrier signal generation module 210, the impedance measurement unit 230, the switching units 241 and 245, the signal processing unit 235, and the control unit 250 are the same as the descriptions of the carrier signal generation module 110, the impedance measurement unit 130, the switching unit, the signal processing unit 135, and the control unit 150 in FIG. 3, their detailed description will be omitted.

In addition, in the above embodiment, the switching unit is connected in series to both ends of each of the battery cell 1 and the first and second resistors 121 and 123 (or the variable resistor 220) but may be connected in series to only one end of the both ends of each of the battery cell 1 and the first and second resistors 121 and 123 (or the variable resistor 220). That is, the high impedance carrier signal of the carrier signal generation modules 110 and 210 may be selectively applied to any one of the battery cell 1 and the first and second resistors 121 and 123 (or the variable resistor 220).

Meanwhile, the present invention may be implemented as a battery pack. For example, a battery pack according to an embodiment of the present invention may include at least one battery cell that can be charged and discharged; a battery management system for controlling charging and discharging of the battery cell; and a battery cell resistance measurement device for measuring the internal resistance of the battery cell.

As described above, according to the present invention, it is possible to accurately measure the internal resistance of battery cells without being affected by external noise or changes in external loads and in addition, by using the measured internal resistance of the battery cell, it is possible to accurately predict the power of the battery cell and the life of the battery cell.

Although the present invention has been described above by limited embodiments and drawings, the present invention is not limited thereto, and it will be apparent to those skilled in the art that the present invention may be implemented in various ways within the equivalent scope of the technical spirit of the present invention and the claims to be described below.

The invention claimed is:

1. A battery cell resistance measurement device comprising:
    a carrier signal generation module configured to generate a first carrier signal at a first frequency and a second carrier signal at a second frequency different from the first frequency;
    a first resistor;
    a second resistor having a different resistance value from the first resistor;
    an impedance measurement unit configured to measure an impedance of a target while the first or second carrier signal is applied to the target;
    a switching unit configured to selectively connect any one of the first resistor, the second resistor, and the battery cell to the impedance measurement unit, wherein whichever of the first resistor, the second resistor, or the battery cell that is connected to the impedance measurement unit is the target; and
    a control unit configured to calculate an internal resistance of the battery cell based on the impedance of one or more targets measured by the impedance measurement unit,
    wherein the control unit is configured to:

generate an adjustment parameter based on an impedance value measured by applying a given one of the first or second carrier signal to each of the first resistor and the second resistor, and calculate the internal resistance of the battery cell based on the impedance value measured by applying the given one of the first or second carrier signal to the battery cell and the adjustment parameter.

2. The battery cell resistance measurement device of claim 1, wherein the first carrier signal is a high impedance carrier signal at a frequency equal to or less than a preset first reference frequency, wherein the second carrier signal is a high impedance carrier signal at a frequency equal to or greater than a preset second reference frequency, and wherein the first reference frequency is less than the second reference frequency.

3. The battery cell resistance measurement device of claim 1, wherein a resistance of the first resistor is an expected minimum resistance value when the battery cell is in an open voltage state, wherein a resistance of the second resistor is an expected maximum resistance value when the battery cell is in an open voltage state.

4. The battery cell resistance measurement device of claim 1, wherein the impedance measurement unit further comprises a signal processing unit configured to:

generate an I signal of the same phase as an impedance signal received through the impedance measurement unit and a Q signal delayed by 90 degrees with respect to the impedance signal; and remove a noise component from the measured impedance signal based on the generated I signal and the generated Q signal.

5. The battery cell resistance measurement device of claim 1, wherein the control unit is configured to calculate a DC component resistance and an AC component impedance of an internal resistance using the first and second carrier signals.

6. The battery cell resistance measurement device of claim 5, wherein the control unit is configured to calculate a capacity of the battery cell based on the calculated DC component resistance and AC component impedance.

7. The battery cell resistance measurement device of claim 5, wherein the control unit is configured to estimate a life of the battery cell based on the calculated DC component resistance and AC component impedance.

8. A battery pack comprising:

at least one battery cell capable of charging and discharging;

a battery management system configured to control charging and discharging of the battery cell; and a battery cell resistance measurement device according to claim 1 configured to measure an internal resistance of the battery cell.

9. A battery cell resistance measurement method comprising:

measuring a first impedance value of a target while a first carrier signal at a first frequency or a second carrier signal at a second frequency different from the first frequency is applied to the target, wherein the target is switchable between each of a first resistor and a second resistor having a different resistance value than the first resistor;

generating an adjustment parameter based on the measured first impedance value;

measuring a second impedance value of a battery cell while the first carrier signal or the second carrier signal is applied to the battery cell; and calculating an internal resistance of the battery cell based on the second impedance value and the adjustment parameter, wherein the method further includes:

generating an adjustment parameter based on an impedance value measured by applying a given one of the first or second carrier signal to each of the first resistor and the second resistor, and calculating the internal resistance of the battery cell based on the impedance value measured by applying the given one of the first or second carrier signal to the battery cell and the adjustment parameter.

10. The battery cell resistance measurement method of claim 9, wherein the first impedance value is measured for each of the first resistor and the second resistor while the first carrier signal is applied to each of the first resistor and the second resistor, and wherein the adjustment parameter is based on the measured first impedance values of each of the first and second resistors, the method further comprising:

measuring a third impedance value of a target for each of the first resistor and the second resistor while the second carrier signal is applied to each of the first resistor and the second resistor; and generating a second adjustment parameter based on the third impedance values of each of the first resistor and the second resistor.

11. The battery cell resistance measurement method of claim 10, wherein the first carrier signal is a high impedance carrier signal at a frequency equal to or less than a preset first reference frequency, wherein the second carrier signal is a high impedance carrier signal at a frequency equal to or greater than a preset second reference frequency, wherein the first reference frequency is less than the second reference frequency.

12. The battery cell resistance measurement method of claim 11, wherein calculating of the internal resistance of the battery cell comprises:

calculating a total internal resistance including a DC component resistance and an AC component impedance of the battery cell based on the first adjustment parameter and a fourth impedance value measured from the battery cell by applying the first carrier signal to the battery cell;

calculating the DC component resistance of the battery cell based on the second adjustment parameter and a fifth impedance value measured from the battery cell by applying the second carrier signal of the second frequency to the battery cell; and calculating the AC component impedance of the internal resistance of the battery cell by subtracting the calculated DC component resistance from the calculated total internal resistance.

13. The battery cell resistance measurement method of claim 9, wherein a resistance of the first resistor is at an expected minimum resistance value when the battery cell is in an open voltage state, wherein a resistance of the second resistor is at an expected maximum resistance value when the battery cell is in an open voltage state.

14. The battery cell resistance measurement method of claim 9, wherein the measuring of the impedance value of the target comprises:
- generating an I signal of the same phase as an impedance signal and a Q signal delayed by 90 degrees with respect to the impedance signal; and
- performing signal processing to remove a noise component from the measured impedance signal based on the generated I signal and the generated Q signal.

15. The battery cell resistance measurement method of claim 9, wherein the measuring of the impedance value of the battery cell comprises:
- generating an I signal of the same phase as an impedance signal and a Q signal delayed by 90 degrees with respect to the impedance signal; and
- performing signal processing to remove a noise component from the measured impedance signal based on the generated I signal and the generated Q signal.

\* \* \* \* \*